United States Patent
Jiang et al.

(10) Patent No.: US 10,117,339 B2
(45) Date of Patent: Oct. 30, 2018

(54) MANUFACTURING JIG AND MANUFACTURING APPARATUS FOR TEMPERATURE MEASURING SAMPLE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Yan Jiang, Beijing (CN); Liwen Cai, Beijing (CN); Xiaowei Gong, Beijing (CN); Dan Li, Beijing (CN); Peng Sui, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 211 days.

(21) Appl. No.: 14/549,020

(22) Filed: Nov. 20, 2014

(65) Prior Publication Data
US 2015/0351255 A1    Dec. 3, 2015

(30) Foreign Application Priority Data

May 30, 2014    (CN) .......................... 2014 1 0239995

(51) Int. Cl.
  *H05K 3/36*    (2006.01)
(52) U.S. Cl.
  CPC ....... *H05K 3/361* (2013.01); *H05K 2203/104* (2013.01); *H05K 2203/1509* (2013.01); *H05K 2203/163* (2013.01)
(58) Field of Classification Search
  CPC . B24B 41/06; B25B 11/002; H01L 2924/002; H01K 13/0061;
  (Continued)

(56) References Cited

U.S. PATENT DOCUMENTS 1,317,753 A * 10/1919 Braden ..................... B26F 1/44
                                                        451/241
1,452,701 A *  4/1923 Pike ........................ G01K 1/14
                                                        248/230.6
(Continued)

OTHER PUBLICATIONS

Clamps and Clamping (Laboratory Manual), James W Zubrick, Mar. 9, 2013, http://what-when-how.com/organic-chemistry-laboratory-survival-manual/clamps-and-clamping-laboratory-manual/, accessed Aug. 26, 2016.*

*Primary Examiner* — Joseph J Hail
*Assistant Examiner* — Arman Milanian
(74) *Attorney, Agent, or Firm* — Nath Goldberg & Meyer; Joshua B. Goldberg; Stanley Protigal

(57) ABSTRACT

Embodiments of the present invention provide a manufacturing jig and a manufacturing apparatus for a temperature measuring sample. The manufacturing jig for a temperature measuring sample includes a first clamping mechanism configured to clamp the strip thermometer and adjust position of the strip thermometer, so that the best temperature measuring point at an end of the strip thermometer is at width center point of the coupling end of the printed circuit board. With the first clamping mechanism, the best temperature measuring point can be located at the width center point of the coupling end, so that alignment deviation of the best temperature measuring point in the width direction of the coupling end due to manual alignment is greatly reduced, which further ensures temperature measuring result of the temperature measuring sample are more accurate, and accurate control on actual pressing temperature of the pressing device can be achieved.

19 Claims, 3 Drawing Sheets

(58) Field of Classification Search
CPC ..... H05K 2203/104; H05K 2203/1509; H05K 2203/163; H05K 3/36; H05K 3/361; G01K 1/14; G01K 1/146; G01K 1/143
USPC .......... 29/281.1; 269/8, 58, 43, 37; 374/152, 374/208, 141, 100, E1.018; 228/212, 228/213; 324/321
See application file for complete search history.

(56) References Cited

U.S. PATENT DOCUMENTS

| | | | | |
|---|---|---|---|---|
| 2,297,868 A * | 10/1942 | Bergeron | ............... | G01K 1/14 136/221 |
| 2,605,790 A * | 8/1952 | Schwarzer | ............... | B27F 5/12 144/144.51 |
| 2,672,776 A * | 3/1954 | Elsenheimer | ........... | B25B 1/125 269/184 |
| 2,906,124 A * | 9/1959 | Chaney | ................... | G01K 1/14 248/37.6 |
| 3,359,836 A * | 12/1967 | Jalava | ................... | B23Q 16/04 269/99 |
| 3,361,891 A * | 1/1968 | Whitefield | ......... | H05K 13/0465 219/85.19 |
| 3,400,925 A * | 9/1968 | Tobias | ............... | G03B 27/6214 269/293 |
| 3,634,649 A * | 1/1972 | Rager | ................... | H01R 4/625 174/90 |
| 3,648,019 A * | 3/1972 | Brewitz | ............... | G03D 15/027 219/216 |
| 3,696,985 A * | 10/1972 | Herring | ............ | H01L 21/67144 219/56.21 |
| 3,946,931 A * | 3/1976 | Bahnck | ............ | H01L 21/67144 228/102 |
| 4,425,507 A * | 1/1984 | Panov | ................... | H01J 37/20 250/442.11 |
| 4,635,055 A * | 1/1987 | Fernandes | ............. | G01K 1/024 323/357 |
| 4,674,670 A * | 6/1987 | Watanabe | ............ | B23K 20/005 228/102 |
| 4,700,997 A * | 10/1987 | Strand | ................... | A61B 5/0416 439/370 |
| 4,750,804 A * | 6/1988 | Osaka | ................... | G02B 6/3652 385/137 |
| 5,024,622 A * | 6/1991 | Ide | ....................... | G01K 13/002 374/141 |
| 5,059,559 A * | 10/1991 | Takahashi | ........ | H01L 21/67144 219/56.1 |
| 5,066,936 A * | 11/1991 | Hsu | ..................... | B23Q 3/1546 269/8 |
| 5,176,255 A * | 1/1993 | Seidler | ................ | H01L 21/6835 206/724 |
| 5,266,914 A * | 11/1993 | Dickson | ............... | B25B 11/002 269/8 |
| 5,360,974 A * | 11/1994 | Hammond | .............. | B23Q 1/36 248/179.1 |
| 5,709,373 A * | 1/1998 | Wasylynko | ............ | A63C 11/14 269/16 |
| 5,762,237 A * | 6/1998 | Chang | ..................... | B05C 17/01 222/153.09 |
| 5,762,327 A * | 6/1998 | Loustau | ............... | G02B 6/3616 269/103 |
| 5,785,305 A * | 7/1998 | Stalker | .................... | B25B 5/142 269/228 |
| 6,003,851 A * | 12/1999 | Araki | ................... | H01R 43/005 269/228 |
| 6,415,679 B1 * | 7/2002 | Chiodo | ...................... | B25J 7/00 269/71 |
| 6,544,377 B1 * | 4/2003 | Minamitani | ......... | H01L 21/563 156/299 |
| 7,416,332 B2 * | 8/2008 | Rountree | ................ | G01K 1/14 257/180 |
| 8,220,340 B2 * | 7/2012 | Zhang | .................. | G01L 5/0038 73/856 |
| 2002/0136263 A1 * | 9/2002 | Wilkins | .................. | G01K 1/14 374/141 |
| 2003/0120282 A1 * | 6/2003 | Scouten | ................ | A61B 90/10 606/130 |
| 2006/0226589 A1 * | 10/2006 | Yonenoi | ................. | A01K 97/28 269/71 |
| 2007/0100253 A1 * | 5/2007 | Sisk | ........................ | G01K 1/14 600/549 |
| 2009/0127681 A1 * | 5/2009 | Son | ....................... | H01L 21/565 257/675 |
| 2009/0141433 A1 * | 6/2009 | Maloney | ................ | G01D 11/24 361/679.01 |
| 2009/0268780 A1 * | 10/2009 | Liu | ........................ | G01K 7/02 374/179 |
| 2011/0049087 A1 * | 3/2011 | Ferguson | ............... | B23Q 3/062 216/13 |
| 2011/0056300 A1 * | 3/2011 | Waggot | ................ | G01M 5/005 73/662 |
| 2011/0291339 A1 * | 12/2011 | Yu | ........................... | B25B 5/006 269/59 |
| 2012/0243839 A1 * | 9/2012 | Tamekuni | ........... | G02B 6/2555 385/97 |
| 2013/0183862 A1 * | 7/2013 | Ni | .......................... | H01R 12/71 439/620.22 |
| 2013/0243385 A1 * | 9/2013 | Nguyen | .................... | G02B 6/245 385/135 |
| 2014/0146849 A1 * | 5/2014 | Randall | ................... | G01K 1/14 374/141 |

* cited by examiner

MANUFACTURING JIG AND MANUFACTURING APPARATUS FOR TEMPERATURE MEASURING SAMPLE

FIELD OF THE INVENTION

The present invention relates to the field of manufacturing technology of display product, and particularly to a manufacturing jig and a manufacturing apparatus for a temperature measuring sample.

BACKGROUND OF THE INVENTION

In the process of manufacturing a thin film transistor liquid crystal display (TFT-LCD), it is inevitable to involve bonding connection between a printed circuit board (PCB) and a flexible printed circuit board (FPCB).

The bonding connection between a PCB and a FPCB generally comprises steps as follows: first, a coupling end of the PCB and a coupling end of the FPCB are aligned and fitted, bonding adhesive is applied between the fitted coupling ends of the PCB and the FPC board, and then the coupling ends of the PCB and the FPCB are pressed by a pressing device, so as to bond both coupling ends together.

The pressing device may heat a to-be-pressed area while applying pressure to the area, to cause the bonding adhesive applied between the fitted coupling ends to be melted, so that the coupling ends of the PCB and the FPCB are bonded tightly. For example, in a traditional pressing process, the pressing temperature of the pressing device usually needs to be controlled in the range of 160-180 degrees centidegrade, which can ensure the best bonding performance of the bonding adhesive. In addition, when the coupling ends of a PCB and a FPCB having different circuits are pressed, the pressing temperature required for the pressing device is different. Thus, the pressing temperature of the pressing device during an actual pressing process needs to be controlled accurately.

To control the pressing temperature of the pressing device during the pressing process accurately, generally, a temperature measuring sample similar to the actual to-be-pressed product (i.e. the structure formed by fitting the PCB and the FPCB together) needs to be manufactured, and a strip-like thermometer is provided in the temperature measuring sample. When the temperature measuring sample is pressed, the pressing temperature of the pressing device can be measured by the strip thermometer in the temperature measuring sample, so that during the actual pressing process, the pressing temperature of the pressing device can be controlled within the optimum temperature range according to actually requirement.

The temperature measuring sample is generally manufactured by setting the best temperature measuring point of the strip thermometer to be at the center (i.e. the intersection of the diagonals of a goldfinger) of the coupling end (e.g. the goldfinger) of the PCB, and then fitting the FPC thereon. The temperature measuring sample can measure the pressing temperature of the pressing device, so as to adjust and control the pressing temperature during the actual pressing process.

Currently, the temperature measuring sample is manufactured by manually setting the best temperature measuring point of the strip thermometer to be at the center of the coupling end of the PCB through observation with human eyes. However, as a human hand is prone to shake during the manual setting, which can easily cause the best temperature measuring point to deviate from the center of the coupling end. For example, as shown in FIG. 1, the best temperature measuring point 21 of a strip thermometer 2 is prone to deviate from a center point of a coupling end 31 in a width direction due to manual alignment, since the width of the coupling end 31 is quite small, the best temperature measuring point 21 easily deviates into an interval region 32 between adjacent coupling ends 31, and the interval region 32 is slightly recessed with respect to the coupling end 31. Therefore, the finally-measured temperature may be lower than the actual temperature at the width center of the coupling end 31, and along the width direction of the coupling end 31, every deviation of 0.1 mm from the width center of the coupling end 31 may cause the measurement result to be lowered by 2-3 degrees centigrade. As shown in FIG. 2, the best temperature measuring point 21 of the strip thermometer 2 deviates from a center point of the coupling end 31 in a length direction, resulting in that the best temperature measuring point 21 will not coincide with center of a pressing end of a pressing device. Therefore, the finally-measured temperature may be lower than the actual temperature of the pressing end of the pressing device, and along the length direction of the coupling end 31, every deviation of 0.5 mm from the length center of the coupling end 31 may cause the measurement result to have a deviation of 3-5 degrees centigrade.

SUMMARY OF THE INVENTION

An object of the present invention is to provide a manufacturing jig and a manufacturing apparatus for a temperature measuring sample. The manufacturing jig for a temperature measuring sample allows the best temperature measuring point of a strip thermometer to be at a width center point of a coupling end of a PCB, so that an alignment deviation of the best temperature measuring point in the width direction of the coupling end due to manual alignment is greatly reduced, which ensures that temperature measuring result of the temperature measuring sample is more accurate.

Embodiments of the present invention provide a manufacturing jig for a temperature measuring sample, the temperature measuring sample is formed by fitting a coupling end of a printed circuit board, the best temperature measuring point of a strip thermometer and a FPCB correspondingly, the manufacturing jig for a temperature measuring sample includes a first clamping mechanism, which is configured to clamp the strip thermometer and adjust position of the strip thermometer, so that the best temperature measuring point located at an end of the strip thermometer is at a width center point of the coupling end of the printed circuit board.

Preferably, the first clamping mechanism includes a first supporting part, a clamping part and a first adjustment part, the first supporting part is connected to the first adjustment part, and is used for supporting the first adjustment part; the clamping part is movably connected to the first adjustment part, and is capable of reciprocating in X-axis direction, which is parallel to a width direction of the coupling end of the printed circuit board, when driven by the first adjustment part.

Preferably, the clamping part includes an upper clamping plate and a lower clamping plate, a side edge of the upper clamping plate is connected to a side edge of the lower clamping plate through a first connecting member, and the upper clamping plate is capable of rotating around the first connecting member, such that the upper clamping plate and the lower clamping plate form an included angle therebetween, or are folded.

Preferably, first magnetic elements capable of attracting each other are provided on edge regions, at a side away from the first connecting member, of the folded surfaces facing each other of the upper clamping plate and the lower clamping plate, respectively, and the first magnetic elements enable the upper clamping plate and the lower clamping plate to be fitted completely and attracted together.

Preferably, a groove is provided in a middle region of the folded surface of the lower clamping plate, the groove has a shape similar to a shape of the strip thermometer, a length direction of the groove is perpendicular to the X-axis direction, and the groove extends from a side edge of the lower clamping plate to an opposite side edge of the same in the length direction thereof; a width and a depth of the groove match with a width and a depth of the strip thermometer, respectively.

Preferably, the first adjustment part includes a first pushing rod and a first elastic element, which are provided at two opposite sides of the clamping part in the X-axis direction, respectively, a first end of the first pushing rod and a first end of the first elastic element are provided facing each other and contact two opposite side surfaces of the lower clamping plate, respectively, the first end of the first pushing rod and the first end of the first elastic elements are capable of exerting pushing forces in opposite directions on the lower clamping plate, and the pushing forces in opposite directions are in a straight line.

Preferably, the first adjustment part further comprises a first sliding rail, a length direction of which is parallel to the X-axis direction, a first sliding chute is provided on a surface of the lower clamping plate back against the upper clamping plate, the first sliding chute is capable of being nested in the first sliding rail and moving in the length direction of the first sliding rail, so that the clamping part is capable of reciprocating in the length direction of the first sliding rail.

Preferably, the first adjustment part further comprises a first connecting tube and a first handle, an end of the first handle is movably provided in the first connecting tube and connected to a second end of the first pushing rod which is movably provided in the first connecting tube, the first handle is capable of driving the second end of the first pushing rod to reciprocate in the first connecting tube when driven manually, so that the first pushing rod is capable of reciprocating in the X-axis direction.

Preferably, the first supporting part includes a first base and a second base, which are provided at two opposite sides of the clamping part in the X-axis direction, respectively, the first base is connected to the first connecting tube, and is used for supporting and fixing the first connecting tube, and the second base is connected to a second end of the first elastic element, and is used for supporting and fixing the second end of the first elastic element.

Preferably, the manufacturing jig for a temperature measuring sample further includes a second clamping mechanism for clamping and fixing the printed circuit board, and relative position and spacing between the second clamping mechanism and the first clamping mechanism are set such that the best temperature measuring point of the strip thermometer is at a length center point of the coupling end of the printed circuit board.

Preferably, the second clamping mechanism includes a stage for bearing a portion of the printed circuit board provided with the coupling end, and a first clamping part and a second clamping part, which are respectively provided at two opposite sides of the stage, and are used for clamping a portion, other than the portion provided with the coupling end, of the printed circuit board.

Preferably, the first clamping part and the second clamping part have a same structure; the first clamping part includes a first clamping plate and a second clamping plate, a side edge of the first clamping plate is connected to a side edge of the second clamping plate through a second connecting member, and the first clamping plate is capable of rotating around the second connecting member, such that the first clamping plate and the second clamping plate form an included angle therebetween, or are folded.

Preferably, the folded surfaces, which face each other, of the first clamping plate and the second clamping plate adopt a foam material, and a bearing surface of the stage for bearing the printed circuit board adopts a rubber material.

Preferably, second magnetic elements capable of attracting each other are provided on edge regions, at a side away from the second connecting member, of the folded surfaces facing each other of the first clamping plate and the second clamping plate respectively, and the second magnetic elements enable the first clamping plate and the second clamping plate to be fitted completely and attracted together.

Preferably, the second clamping mechanism further includes a second adjustment part, the second adjustment part includes a second pushing rod and a second elastic element, which are provided at outer sides of the first clamping part and the second clamping part away from the stage in the X-axis direction, respectively; a first end of the second pushing rod and a first end of the second elastic element are provided facing each other, and contact outer side surfaces of the first clamping part and the second clamping part away from the stage in the X-axis direction, respectively, the first end of the second pushing rod and the first end of the second elastic elements are capable of exerting pushing forces in opposite directions on the first clamping part and the second clamping part, and the pushing forces in opposite directions are in a straight line.

Preferably, the second adjustment unit further includes a second sliding rail, a length direction of which is parallel to the X-axis direction, a second sliding chute is provided on surfaces of the first clamping part, the stage and the second clamping part back against the bearing surface of the stage, the second sliding chute is capable of being nested in the second sliding rail and moving in the length direction of the second sliding rail, so that the first clamping part, the stage and the second clamping part are capable of reciprocating in the length direction of the second sliding rail.

Preferably, the second adjustment part further includes a second connecting tube and a second handle, an end of the second handle is movably provided in the second connecting tube and connected to a second end of the second pushing rod which is movably provided in the second connecting tube, the second handle is capable of driving the second end of the second pushing rod to reciprocate in the second connecting tube when driven manually, so that the second pushing rod is capable of reciprocating in the X-axis direction.

Preferably, the second clamping mechanism further includes a second supporting part, the second supporting part includes a third base and a fourth base, which are provided at the outer sides of the first clamping part and the second clamping part away from the stage in the X-axis direction, respectively, the third base is connected to the second connecting tube, and is used for supporting and fixing the second connecting tube, and the fourth base is connected to a second end of the second elastic element, and is used for supporting and fixing the second end of the second elastic element.

Preferably, both the first magnetic elements and the second magnetic elements are magnets; both the first elastic element and the second elastic element are springs, both the first connecting member and the second connecting member are shafts capable of rotating around an axis in the range of 0-180 degrees; the first connecting tube and the second connecting tube are provided with graduations whose degree of accuracy is 0.001 mm.

Preferably, the manufacturing jig for a temperature measuring sample further comprises a support plate on which the first clamping mechanism and the second clamping mechanism are provided, and a microscope for observing positions of the best temperature measuring point of the strip thermometer and the coupling end of the printed circuit board.

The embodiments of the present invention also provide a manufacturing apparatus for a temperature measuring sample, which comprises any one of the above-described manufacturing jig for a temperature measuring sample.

The beneficial effects of the present invention: in the manufacturing jig for a temperature measuring sample, with the first clamping mechanism, the best temperature measuring point of the strip thermometer can be located at the width center point of the coupling end of the printed circuit board, so that an alignment deviation of the best temperature measuring point in the width direction of the coupling end due to manual alignment is greatly reduced, which further ensures that the temperature measuring result obtained by the temperature measuring sample is more accurate, and accurate control on actual pressing temperature of the pressing device can be achieved.

In the manufacturing apparatus for a temperature measuring sample, by using the above manufacturing jig for a temperature measuring sample, the manufacturing quality and manufacturing efficiency of the manufacturing apparatus for a temperature measuring sample can be improved, and the production efficiency is further improved.

Figure 1:
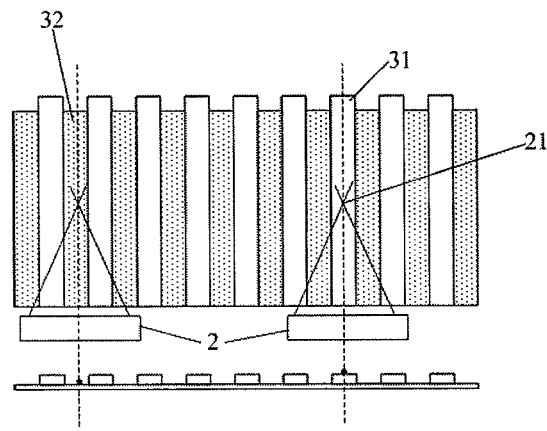
FIG. 1 is a schematic diagram illustrating that the best temperature measuring point of a strip thermometer deviates from a center in a width direction of a coupling end of a printed circuit board in the prior art.
Figure 2:
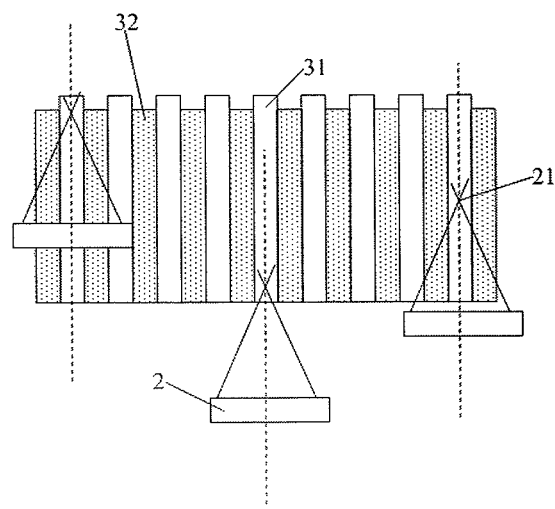
FIG. 2 is a schematic diagram illustrating that the best temperature measuring point of a strip thermometer deviates from a center in a length direction of a coupling end of a printed circuit board in the prior art.

REFERENCE NUMERALS 1. first clamping mechanism; 11. clamping part; 111. upper clamping plate; 112. lower clamping plate; 113. first connecting member; 114. first magnetic element; 115. groove; 12. first adjustment part; 121. first pushing rod; 122. first elastic element; 123. first sliding rail; 124. first connecting tube; 125. first handle; 13. first supporting part; 131. first base; 132. second base; 2. strip thermometer; 21. best temperature measuring point; 3. printed circuit board; 31. coupling end; 32. interval region; 4. second clamping mechanism; 41. stage; 42. first clamping part; 421. first clamping plate; 422. second clamping plate; 423. second connecting member; 424. second magnetic element; 43. second clamping part; 5. support plate.

DETAILED DESCRIPTION OF THE EMBODIMENTS

To enable a person skilled in the art to better understand the technical solutions of the present invention, a manufacturing jig and a manufacturing apparatus for a temperature measuring sample provided by embodiments of the present invention are described below in detail in conjunction with the accompanying drawings and specific implementations.

Embodiment 1

Figure 3:
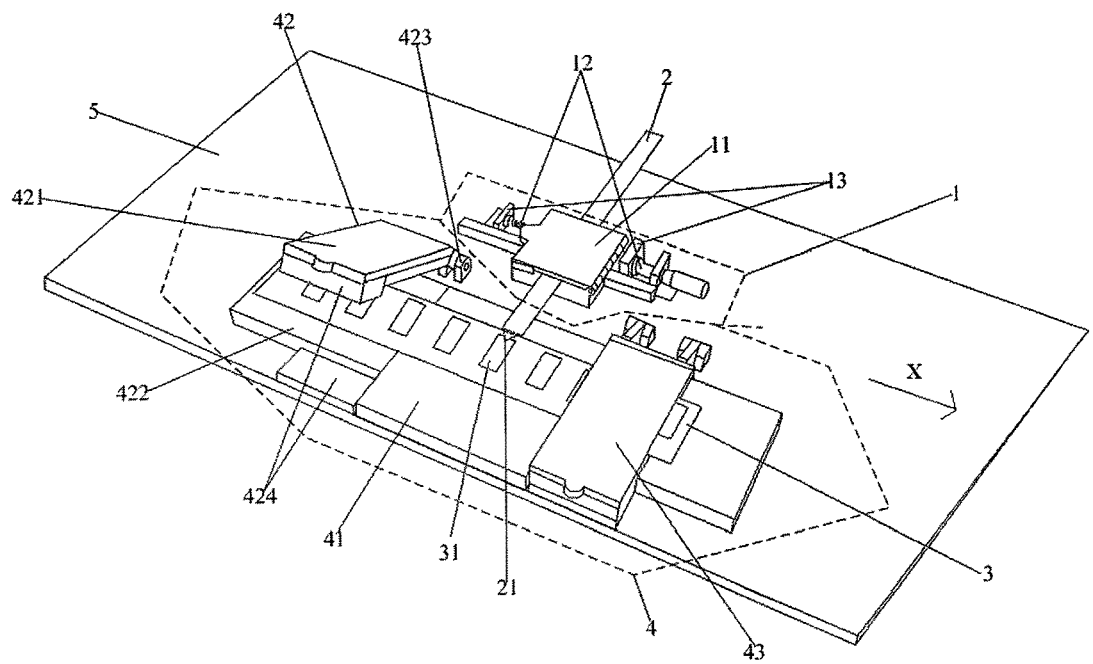
FIG. 3 is a schematic diagram of a structure of a manufacturing jig for a temperature measuring sample provided by an embodiment of the present invention.

The present embodiment provides a manufacturing jig for a temperature measuring sample, the temperature measuring sample is formed by fitting a coupling end of a printed circuit board, the best temperature measuring point of a strip thermometer and a FPCB correspondingly, as shown in FIG. 3, the manufacturing jig for a temperature measuring sample includes a first clamping mechanism 1, which is configured to clamp the strip thermometer 2, and adjust position of the strip thermometer 2, so that the best temperature measuring point 21 located at an end of the strip thermometer 2 is at a width center point of the coupling end 31 of the printed circuit board 3.

It should be noted that, the coupling end 31 of the printed circuit board 3 usually has a shape of rectangle, the length of a long side of the rectangle is defined as the length of the coupling end 31, and the length of a short side of the rectangle is defined as the width of the coupling end 31. Further, in FIG. 3, to show the coupling end 31 clearly, the size of the coupling end 31 is exaggerated, and exaggeration of the size of the coupling end 31 in its width direction is even more obvious.

The first clamping mechanism 1 includes a first supporting part 13, a clamping part 11 and a first adjustment part 12, the first supporting part 13 is connected to the first adjustment part 12, and is used for supporting the first adjustment part 12; the clamping part 11 is movably connected to the first adjustment part 12, and can reciprocate in X-axis direction, which is parallel to the width direction of the coupling end 31 of the printed circuit board 3, when driven by the first adjustment part 12.

Figure 4:
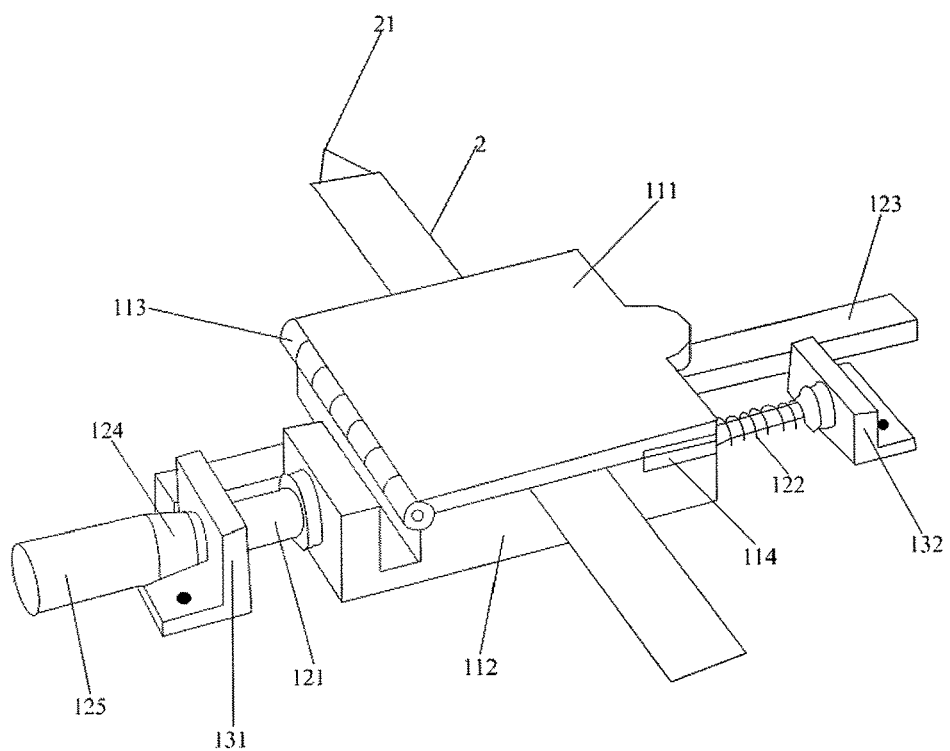
FIG. 4 is a schematic diagram of a structure of the first clamping mechanism in FIG. 3.
Figure 5:
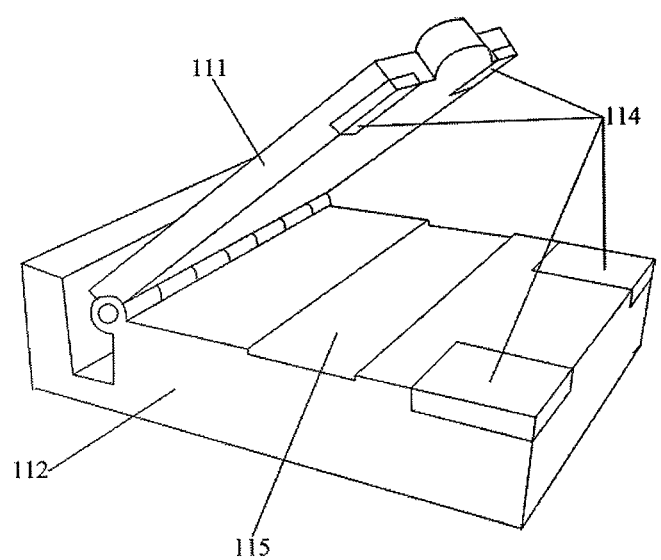
FIG. 5 is a schematic diagram of a structure of the clamping part of the first clamping mechanism in FIG. 3.

As shown in FIGS. 3 to 5, the clamping part 11 includes an upper clamping plate 111 and a lower clamping plate 112, a side edge of the upper clamping plate 111 is connected to a side edge of the lower clamping plate 112 through a first connecting member 113, and the upper clamping plate 111 can rotate around the first connecting member 113, such that the upper clamping plate 111 and the lower clamping plate 112 form an included angle therebetween or are folded. Here, the first connecting member 113 is a shaft which can rotate around an axis in the range of 0-180 degrees.

In the present embodiment, first magnetic elements 114 that can attract each other are provided on edge regions, at a side away from the first connecting member 113, of the folded surfaces of the upper clamping plate 111 and the lower clamping plate 112 facing each other, respectively, and the first magnetic elements 114 can enable the upper clamping plate 111 and the lower clamping plate 112 to be fitted completely and attracted together. Here, the first magnetic elements 114 are magnets or any device that can enable the upper clamping plate 111 and the lower clamping plate 112 to be fitted completely and attracted together. With the first magnetic elements 114, the upper clamping plate 111 and the lower clamping plate 112 can clamp the strip thermometer 2 tightly, which facilitates adjusting position of the strip thermometer 2.

In the present embodiment, to fit the upper clamping plate 111 and the lower clamping plate 112 completely, the folded surfaces of the magnets provided on the folded surfaces of the upper clamping plate 111 and the lower clamping plate 112 correspondingly are flush with the folded surfaces of the upper clamping plate 111 and the lower clamping plate 112, respectively. It should be noted that, to fit the upper clamping plate 111 and the lower clamping plate 112 completely, the folded surface of the magnet provided on one of the upper clamping plate 111 and the lower clamping plate 112 may be higher than the folded surface of the one clamping plate, while the folded surface of the magnet provided on the other clamping plate may be lower than the folded surface of the other clamping plate, and the folded surfaces of the upper clamping plate 111 and the lower clamping plate 112 are completely fitted after the magnets provided correspondingly are attracted together, which can also enable the upper clamping plate 111 and the lower clamping plate 112 to clamp the strip thermometer 2 more tightly.

Here, a groove 115 is provided in a middle region of the folded surface of the lower clamping plate 112, the groove 115 has a shape similar to that of the strip thermometer 2, a length direction of the groove 115 is perpendicular to the X-axis direction (since the X-axis direction is parallel to the width direction of the coupling end 31 of the printed circuit board 3, the length direction of the groove 115 is perpendicular to the width direction of the coupling end 31 of the printed circuit board 3, so that position adjustment of the best temperature measuring point 21 at an end of the strip thermometer 2 can always be performed in the width direction of the coupling end 31 until the best temperature measuring point 21 is at a width center point of the coupling end 31), and the groove 115 extends from a side edge of the lower clamping plate 112 to an opposite side edge of the same in the length direction thereof; the width and the depth of the groove 115 match with the width and the depth of the strip thermometer 2, respectively. As such, a certain segment of the strip thermometer 2 is exactly embedded in the groove 115, and the upper surface of the strip thermometer 2 exposed to the outside is just flush with the folded surface of the lower clamping plate 112, so that the strip thermometer 2 will not slip during the position adjustment.

In the present invention, the first adjustment part 12 includes a first pushing rod 121 and a first elastic element 122, which are provided at two opposite sides of the clamping part 11 along the X-axis direction, respectively, a first end of the first pushing rod 121 and a first end of the first elastic element 122 are provided facing each other and contact two opposite side surfaces of the lower clamping plate 112 respectively, the first end of the first pushing rod 121 and the first end of the first elastic element 122 can exert pushing forces in opposite directions on the lower clamping plate 112, and the pushing forces in opposite directions are in a straight line. Here, the first elastic element 122 is a spring or any device that can exert pushing force on the lower clamping plate 112 along a direction parallel to the X-axis direction in an elastic manner. The first pushing rod 121 and the first elastic element 122 allow the clamping part 11 to be subjected to balance forces during movement, thus the position adjustment of the clamping part 11 is accurate and effective.

The first adjustment part 12 further comprises a first sliding rail 123, a length direction of which is parallel to the X-axis direction, a first sliding chute is provided on a surface of the lower clamping plate 112 back against the upper clamping plate 111, the first sliding chute can be nested in the first sliding rail 123 and move in the length direction of the first sliding rail 123, so that the clamping part 11 can reciprocate in the length direction of the first sliding rail 123. The first sliding rail 123 can make the position adjustment of the clamping part 11 more smooth, and enable the clamping part 11 to move in the X-axis direction all the time, thus ensuring that the position adjustment of the best temperature measuring point 21 of the strip thermometer 2 is always performed in the width direction of the coupling end 31 of the printed circuit board 3.

In the present embodiment, the first adjustment part 12 further comprises a first connecting tube 124 and a first handle 125, an end of the first handle 125 is movably provided in the first connecting tube 124 and connected to a second end of the first pushing rod 121 which is movably provided in the first connecting tube 124, the first handle 125 can drive the second end of the first pushing rod 121 to reciprocate in the first connecting tube 124 manually, so that the first pushing rod 121 can reciprocate in the X-axis direction. The first connecting tube 124 is provided with graduations whose degree of accuracy is 0.001 mm.

For example, in the present embodiment, the first connecting tube 124, the first handle 125 and the first pushing rod 121 may be combined in a micrometer (micrometer caliper) form, manually rotating the first handle 125 (corresponding to thimble of the micrometer) can drive the first pushing rod 121 (corresponding to spindle of the micrometer) to move back and forth, and meanwhile the degree of accuracy at which the first pushing rod 121 moves back and forth can reach 0.001 mm. This degree of accuracy can greatly reduce the position deviation of the best temperature measuring point 21 of the strip thermometer 2 in the width direction of the coupling end 31, thus the best temperature measuring point 21 can be positioned at the width center point of the coupling end 31 accurately, and further accuracy of temperature measurement is improved.

In the present embodiment, the first supporting part 13 includes a first base 131 and a second base 132, which are provided at two opposite sides of the clamping part 11 in the X-axis direction, respectively, the first base 131 is connected to the first connecting tube 124, and is used for supporting and fixing the first connecting tube 124, and the second base 132 is connected to a second end of the first elastic element 122, and is used for supporting and fixing the second end of the first elastic element 122.

In the present embodiment, the manufacturing jig further includes a second clamping mechanism 4 for clamping and fixing the printed circuit board 3, and relative position and spacing between the second clamping mechanism 4 and the first clamping mechanism 1 can be set such that the best temperature measuring point 21 of the strip thermometer 2 is positioned at the length center point of the coupling end 31 of the printed circuit board 3. In the meanwhile, by embedding different parts of the strip thermometer 2 in the groove 115, the effect of fixing the best temperature measuring point 21 of the strip thermometer 2 at the length center point of the coupling end 31 of the printed circuit board 3 can also be achieved.

As shown in FIG. 3, the second clamping mechanism 4 includes a stage 41 for bearing a portion of the printed circuit board 3 provided with the coupling end 31, and a first clamping part 42 and a second clamping part 43, which are respectively provided at two opposite sides of the stage 41, and are used for clamping a portion, other than the portion provided with the coupling end 31, of the printed circuit board 3. The second clamping mechanism 4 can fix the printed circuit board 3 stably, and thus manufacturing accuracy and manufacturing quality of the temperature measuring sample can be significantly improved.

In the present embodiment, the first clamping part 42 has the same structure and material as the second clamping part 43. By taking the first clamping part 42 as an example, as shown in FIG. 3, the first clamping part 42 includes a first clamping plate 421 and a second clamping plate 422, a side edge of the first clamping plate 421 is connected to a side edge of the second clamping plate 422 through a second connecting member 423, and the first clamping plate 421 can rotate around the second connecting member 423, such that the first clamping plate 421 and the second clamping plate 422 form an included angle therebetween, or are folded. Here, the second connecting member 423 is a shaft that can rotate around an axis in the range of 0-180 degrees.

The folded surfaces, which face each other, of the first clamping plate 421 and the second clamping plate 422 adopt a foam material, and a bearing surface of the stage 41 for bearing the printed circuit board 3 adopts a rubber material. The foam material has cushioning performance, and therefore the electrical components on the printed circuit board 3 can be protected from being crushed when being clamped; the rubber material has both cushioning performance and hardness, and therefore can ensure that the coupling end 31 of the printed circuit board 3 placed thereon and the best temperature measuring point 21 of the strip thermometer 2 are in appropriate correspondence and adhere to each other.

In the present invention, second magnetic elements 424 that can attract each other are provided on edge regions, at a side away from the second connecting member 423, of the folded surfaces facing each other of the first clamping plate 421 and the second clamping plate 422, respectively, and the second magnetic elements 424 can cause the first clamping plate 421 and the second clamping plate 422 to be fitted completely and attracted together. Here, the second magnetic elements 424 are magnets or any device that can cause the first clamping plate 421 and the second clamping plate 422 to be fitted completely and attracted together. With the second magnetic elements 424, the first clamping plate 421 and the second clamping plate 422 can clamp the printed circuit board 3 tightly, which facilitates position correspondence between the coupling end 31 on the printed circuit board 3 and the best temperature measuring point 21.

It should be noted that, to fit the first clamping plate 421 and the second clamping plate 422 completely, the folded surfaces of the magnets provided on the folded surfaces of the first clamping plate 421 and the second clamping plate 422 correspondingly may be flush with the folded surfaces of the first clamping plate 421 and the second clamping plate 422, respectively. Alternatively, the folded surface of the magnet provided on one of the first clamping plate 421 and the second clamping plate 422 may be higher than the folded surface of the one clamping plate, while the folded surface of the magnet provided on the other clamping plate may be lower than the folded surface of the other clamping plate, and the folded surfaces of the first clamping plate 421 and the second clamping plate 422 are completely fitted after the magnets provided correspondingly are attracted together, which can enable the first clamping plate 421 and the second clamping plate 422 to clamp the printed circuit board 3 more tightly.

In the present invention, the manufacturing jig further comprises a support plate 5 on which the first clamping mechanism 1 and the second clamping mechanism 4 are provided, and a microscope (not shown in FIGS. 3-5) to assist in observing positions of the best temperature measuring point 21 of the strip thermometer 2 and the coupling end 31 of the printed circuit board 3. The support plate 5 makes it possible to transfer the first clamping mechanism 1 and the second clamping mechanism 4 as a whole, for example, the first clamping mechanism 1 and the second clamping mechanism 4 can be transferred as a whole to a position under the microscope, and can also be moved as a whole relative to lens of the microscope, so that the coupling end 31 of the printed circuit board 3 and the best temperature measuring point 21 of the strip thermometer 2 are aligned and adhered to each other by means of auxiliary observation through the microscope, thus the temperature measuring sample can be made more quickly, and the manufactured temperature measuring sample has better quality.

Embodiment 2

The present embodiment provides a manufacturing jig for a temperature measuring sample, which differs from Embodiment 1 in that the second clamping mechanism further includes a second adjustment part. The second adjustment part includes a second pushing rod and a second elastic element, which are provided at outer sides of the first clamping part and the second clamping part away from the stage in the X-axis direction, respectively; a first end of the second pushing rod and a first end of the second elastic element are provided facing each other, and contact outer side surfaces of the first clamping part and the second clamping part away from the stage in the X-axis direction, respectively; the first end of the second pushing rod and the first end of the second elastic elements can exert pushing forces in opposite directions on the first clamping part and the second clamping part, and the pushing forces in opposite directions are in a straight line.

Here, the second elastic element is a spring or any device that can exert pushing force on the first clamping part and the second clamping part in a direction parallel to the X-axis direction in an elastic manner. The second pushing rod and the second elastic element allow the first clamping part, the second clamping part and the stage provided therebetween to be subjected to balance force during movement, and thus the position adjustment on the first clamping part, the stage and the second clamping part is accurate and effective.

In the present embodiment, the second adjustment part further includes a second sliding rail, a length direction of which is parallel to the X-axis direction, a second sliding chute is provided on surfaces of the first clamping part, the stage and the second clamping part back against the bearing surface of the stage, the second sliding chute can be nested in the second sliding rail and move in the length direction of the second sliding rail, so that the first clamping part, the stage and the second clamping part can reciprocate in the length direction of the second sliding rail.

The second sliding rail can make the position adjustment of the first clamping part, the stage and the second clamping part more smooth, and cause the first clamping part, the stage and the second clamping part to move in a direction parallel to the X-axis direction all the time, thus ensuring that the position adjustment of the best temperature measuring point of the strip thermometer is always performed in the width direction of the coupling end of the printed circuit board.

In the present embodiment, the second adjustment part further includes a second connecting tube and a second handle, an end of the second handle is movably provided in the second connecting tube and connected to a second end of the second pushing rod which is movably provided in the second connecting tube, the second handle can drive the second end of the second pushing rod to reciprocate in the second connecting tube when driven manually, so that the second pushing rod can reciprocate in the X-axis direction. The second connecting tube is provided with graduations whose degree of accuracy is 0.001 mm.

For example, in the present embodiment, the second connecting tube, the second handle and the second pushing rod may be combined in a micrometer form, rotating the second handle (i.e. thimble of the micrometer) manually can drive the second pushing rod (i.e. spindle of the micrometer) to move back and forth, and meanwhile the degree of accuracy at which the second pushing rod moves back and forth can reach 0.001 mm. This degree of accuracy can greatly reduce the position deviation of the best temperature measuring point of the strip thermometer in the width direction of the coupling end, thus the best temperature measuring point can be positioned at the width center point of the coupling end accurately, and further accuracy of temperature measurement is improved.

In the present embodiment, the second clamping mechanism further includes a second supporting part, the second supporting part includes a third base and a fourth base, which are provided at the outer sides of the first clamping part and the second clamping part away from the stage in the X-axis direction, respectively, the third base is connected to the second connecting tube, and is used for supporting and fixing the second connecting tube, and the fourth base is connected to a second end of the second elastic element, and is used for supporting and fixing the second end of the second elastic element.

The second adjustment part and the second supporting part in the second clamping mechanism enable the second clamping mechanism to reciprocate in the X-axis direction, so as to drive the printed circuit board to reciprocate in the X-axis direction, that is, in the present embodiment, both the first clamping mechanism and the second clamping mechanism can reciprocate in the X-axis direction, as a result, the coupling end of the printed circuit board and the best temperature measuring point of the strip thermometer can be aligned more quickly, which further improves the manufacturing efficiency of the temperature measuring sample as well as the manufacturing accuracy of the temperature measuring sample.

Other structures of the manufacturing jig for a temperature measuring sample in the present embodiment are the same as those in Embodiment 1, and are not repeated herein.

It should be noted that, in a condition that both the first and second clamping mechanism can reciprocate in the X-axis direction, the position of the first clamping mechanism may fixed, while the second clamping mechanism moves with respect to the first clamping mechanism, so that the coupling end of the printed circuit board is aligned with the best temperature measuring point of the strip thermometer.

Embodiment 3

The present embodiment provides a manufacturing jig for a temperature measuring sample, which differs from Embodiments 1 and 2 in that the manufacturing jig in the present embodiment does not include the second clamping mechanism.

Since the width of the coupling end of the printed circuit board is quite small, when aligning the best temperature measuring point of the strip thermometer with the coupling end of the printed circuit board, a relatively high alignment accuracy is required, and manual alignment can hardly realize the alignment accuracy in the width direction. Therefore, the first clamping mechanism for clamping the strip thermometer is provided in the present embodiment. On the other hand, since the length of the coupling end of the printed circuit board is relatively large, and the best temperature measuring point can be relatively accurately set at the center of the length of the coupling end or vicinity thereof manually, the second clamping mechanism is omitted in the present embodiment, and if the printed circuit board is fixed on the support plate by other conventional means (for example, by using adhesive tape), the accurate alignment between the best temperature measuring point and the coupling end can also be achieved.

Other structures of the manufacturing jig for a temperature measuring sample in the present embodiment are the same as those in any one of Embodiments 1 and 2, and are not repeated herein.

The beneficial effects of Embodiments 1 to 3: in the manufacturing jig for a temperature measuring sample provided by any one of Embodiments 1 to 3, with the first clamping mechanism, the best temperature measuring point of the strip thermometer can be located at the width center point of the coupling end of the printed circuit board, so that an alignment deviation of the best temperature measuring point in the width direction of the coupling end due to manual alignment is greatly reduced, which further ensures that the temperature measuring result of the temperature measuring sample is more accurate, and precise control on actual pressing temperature of the pressing device can be achieved.

Embodiment 4

The present embodiment provides a manufacturing apparatus for a temperature measuring sample, which includes the manufacturing jig for a temperature measuring sample in any one of Embodiments 1 to 3.

With the manufacturing jig for a temperature measuring sample in any one of Embodiments 1 to 3, the manufacturing quality and manufacturing efficiency of the manufacturing apparatus for a temperature measuring sample can be improved, and the production efficiency is further improved.

It can be understood that the above implementations are merely exemplary implementations used for explaining the principle of the present invention, but the present invention is not limited thereto. For those skilled in the art, various modifications and improvements may be made without departing from the spirit and essence of the present invention, and these modifications and improvements may also be considered to be the protection scope of the present invention.

The invention claimed is:

1. A manufacturing jig for a temperature measuring sample, wherein, the temperature measuring sample is formed by fitting a coupling end of a printed circuit board, the best temperature measuring point of a strip thermometer and a flexible printed circuit board, and the manufacturing jig for a temperature measuring sample comprises:

a first clamping mechanism, which is configured to clamp the strip thermometer and adjust position of the strip thermometer in X-axis direction, so that the best temperature measuring point located at an end of the strip thermometer is at a width center point of the coupling end of the printed circuit board, wherein the X-axis direction is parallel to a width direction of the coupling end of the printed circuit board, wherein:

the first clamping mechanism comprises a first supporting part, a clamping part and a first adjustment part, the first supporting part is connected to the first adjustment part, and is used for supporting the first adjustment part; the clamping part is movably connected to the first adjustment part, and is capable of reciprocating in the X-axis direction when driven by the first adjustment part, and the first adjustment part includes a first pushing rod, a first elastic element, and a first sliding rail, the first pushing rod and the first elastic element are provided at two opposite sides of the clamping part along the X-axis direction, respectively, a length direction of first sliding rail is parallel to the X-axis direction, the clamping part includes an upper clamping plate and a lower clamping plate, with a side edge of the upper clamping plate connected to a side edge of the lower clamping plate through a first connecting member, and a surface of the lower clamping plate distal to the upper clamping plate having a configuration to cooperate with the first sliding rail and slide against the first sliding rail and moving in the length direction of the first sliding rail, so that the clamping part is capable of reciprocating in the length direction of the first sliding rail.

2. The manufacturing jig for a temperature measuring sample of claim 1, wherein the upper clamping plate is capable of rotating around the first connecting member, such that the upper clamping plate and the lower clamping plate form an included angle therebetween, or are folded.

3. The manufacturing jig for a temperature measuring sample of claim 2, wherein, first magnetic elements capable of attracting to each other are provided on edge regions, at a side away from the first connecting member, of the folded surfaces facing each other of the upper clamping plate and the lower clamping plate, respectively, and the first magnetic elements are capable of enabling the upper clamping plate and the lower clamping plate to be fitted completely and attracted together.

4. The manufacturing jig for a temperature measuring sample of claim 3, wherein, a groove is provided in a middle region of the folded surface of the lower clamping plate, the groove has a shape similar to a shape of the strip thermometer, a length direction of the groove is perpendicular to the X-axis direction, and the groove extends from a side edge of the lower clamping plate to an opposite side edge of the same in the length direction thereof; a width and a depth of the groove match with a width and a depth of the strip thermometer, respectively.

5. The manufacturing jig for a temperature measuring sample of claim 4, wherein, a first end of the first pushing rod and a first end of the first elastic element are provided facing each other and contact two opposite side surfaces of the lower clamping plate, respectively, the first end of the first pushing rod and the first end of the first elastic elements are capable of exerting pushing forces in opposite directions on the lower clamping plate, and the pushing forces in opposite directions are in a straight line.

6. The manufacturing jig for a temperature measuring sample of claim 5, wherein, the first adjustment part further comprises a first connecting tube and a first handle, an end of the first handle is movably provided in the first connecting tube and connected to a second end of the first pushing rod which is movably provided in the first connecting tube, the first handle is capable of driving the second end of the first pushing rod to reciprocate in the first connecting tube when driven manually, so that the first pushing rod is capable of reciprocating in the X-axis direction.

7. The manufacturing jig for a temperature measuring sample of claim 6, wherein, the first supporting part includes a first base and a second base, which are provided at two opposite sides of the clamping part in the X-axis direction, respectively, the first base is connected to the first connecting tube, and is used for supporting and fixing the first connecting tube, and the second base is connected to a second end of the first elastic element, and is used for supporting and fixing the second end of the first elastic element.

8. The manufacturing jig for a temperature measuring sample of claim 7, wherein, the manufacturing jig for a temperature measuring sample further includes a second clamping mechanism for clamping and fixing the printed circuit board, and relative position and spacing between the second clamping mechanism and the first clamping mechanism are set such that the best temperature measuring point of the strip thermometer is at a length center point of the coupling end of the printed circuit board.

9. The manufacturing jig for a temperature measuring sample of claim 8, wherein, the second clamping mechanism comprises a stage for bearing a portion of the printed circuit board provided with the coupling end, and a first clamping part and a second clamping part, which are respectively provided at two opposite sides of the stage, and are used for clamping a portion, other than the portion provided with the coupling end, of the printed circuit board.

10. The manufacturing jig for a temperature measuring sample of claim 9, wherein, the first clamping part and the second clamping part have a same structure; the first clamping part comprises a first clamping plate and a second clamping plate, a side edge of the first clamping plate is connected to a side edge of the second clamping plate through a second connecting member, and the first clamping plate is capable of rotating around the second connecting member, such that the first clamping plate and the second clamping plate form an included angle therebetween, or are folded.

11. The manufacturing jig for a temperature measuring sample of claim 10, wherein, the folded surfaces, which face each other, of the first clamping plate and the second clamping plate adopt a foam material, and a bearing surface of the stage for bearing the printed circuit board adopts a rubber material.

12. The manufacturing jig for a temperature measuring sample of claim 11, wherein, second magnetic elements capable of attracting each other are provided on edge regions, at a side away from the second connecting member, of the folded surfaces facing each other of the first clamping plate and the second clamping plate, respectively, and the second magnetic elements are capable of enabling the first clamping plate and the second clamping plate to be fitted completely and attracted together.

13. The manufacturing jig for a temperature measuring sample of claim 12, wherein, the second clamping mechanism further comprises a second adjustment part, the second adjustment part comprises a second pushing rod and a second elastic element, which are provided at outer sides of the first clamping part and the second clamping part away from the stage in the X-axis direction, respectively; a first end of the second pushing rod and a first end of the second elastic element are provided facing each other, and contact outer side surfaces of the first clamping part and the second clamping part away from the stage in the X-axis direction, respectively, the first end of the second pushing rod and the first end of the second elastic elements are capable of exerting pushing forces in opposite directions on the first clamping part and the second clamping part, and the pushing forces in opposite directions are in a straight line.

14. The manufacturing jig for a temperature measuring sample of claim 13, wherein, the second adjustment unit further comprises a second sliding rail, a length direction of which is parallel to the X-axis direction, a sliding chute is provided on surfaces of the first clamping part, the stage and the second clamping part back against the bearing surface of the stage, second sliding chute is capable of being nested in the second sliding rail and moving in the length direction of the second sliding rail, so that the first clamping part, the stage and the second clamping part are capable of reciprocating in the length direction of the second sliding rail.

15. The manufacturing jig for a temperature measuring sample of claim 14, wherein, the second adjustment part further comprises a second connecting tube and a second handle, an end of the second handle is movably provided in the second connecting tube and connected to a second end of the second pushing rod which is movably provided in the second connecting tube, the second handle is capable of driving the second end of the second pushing rod to reciprocate in the second connecting tube when driven manually, so that the second pushing rod is capable of reciprocating in the X-axis direction.

16. The manufacturing jig for a temperature measuring sample of claim 15, wherein, the second clamping mechanism further comprises a second supporting part, the second supporting part comprises a third base and a fourth base, which are provided at the outer sides of the first clamping part and the second clamping part away from the stage in the X-axis direction, respectively, the third base is connected to the second connecting tube, and is used for supporting and fixing the second connecting tube, and the fourth base is connected to a second end of the second elastic element, and is used for supporting and fixing the second end of the second elastic element.

17. The manufacturing jig for a temperature measuring sample of claim 16, wherein, both the first magnetic elements and the second magnetic elements are magnets; both the first elastic element and the second elastic element are springs, both the first connecting member and the second connecting member are shafts capable of rotating around an axis in the range of 0-180 degrees; and the first connecting tube and the second connecting tube are provided with graduations whose degree of accuracy is 0.001 mm.

18. The manufacturing jig for a temperature measuring sample of claim 17, wherein, the manufacturing jig for a temperature measuring sample further comprises a support plate on which the first clamping mechanism and the second clamping mechanism are provided, and a microscope for observing positions of the best temperature measuring point of the strip thermometer and the coupling end of the printed circuit board.

19. A manufacturing jig for a temperature measuring sample, wherein, the temperature measuring sample is formed by fitting a coupling end of a printed circuit board, the best temperature measuring point of a strip thermometer and a flexible printed circuit board, and the manufacturing jig for a temperature measuring sample comprises:
a first clamping mechanism, which is configured to clamp the strip thermometer and adjust position of the strip thermometer in X-axis direction, so that the best temperature measuring point located at an end of the strip thermometer is at a width center point of the coupling end of the printed circuit board, wherein the X-axis direction is parallel to a width direction of the coupling end of the printed circuit board,
wherein:
the first clamping mechanism comprises a first supporting part, a clamping part and a first adjustment part, the first supporting part is connected to the first adjustment part, and is used for supporting the first adjustment part; the clamping part is movably connected to the first adjustment part, and is capable of reciprocating in the X-axis direction when driven by the first adjustment part, and the first adjustment part includes a first pushing rod, a first elastic element, and a first sliding rail, the first pushing rod and the first elastic element are provided at two opposite sides of the clamping part along the X-axis direction, respectively, a length direction of first sliding rail is parallel to the X-axis direction, so that the clamping part is capable of reciprocating in the length direction of the first sliding rail, and
first magnetic elements capable of attracting to each other are provided on edge regions, at a side away from the first connecting member, of the folded surfaces facing each other of the upper clamping plate and the lower clamping plate, respectively, and the first magnetic elements are capable of enabling the upper clamping plate and the lower clamping plate to be fitted completely and attracted together.

* * * * *